United States Patent [19]

Sharpe-Geisler

[11] Patent Number: 5,084,404
[45] Date of Patent: Jan. 28, 1992

[54] GATE ARRAY STRUCTURE AND PROCESS TO ALLOW OPTIONING AT SECOND METAL MASK ONLY

[75] Inventor: Bradley A. Sharpe-Geisler, San Jose, Calif.

[73] Assignee: Advanced Micro Devices, Sunnyvale, Calif.

[21] Appl. No.: 685,586

[22] Filed: Apr. 15, 1991

Related U.S. Application Data

[60] Division of Ser. No. 408,461, Sep. 15, 1989, Pat. No. 5,023,701, which is a continuation of Ser. No. 175,834, Mar. 31, 1988, abandoned.

[51] Int. Cl.[5] ............... H01L 21/70; H01L 27/00
[52] U.S. Cl. .................... 437/51; 437/54; 437/56; 437/57; 437/245; 357/71
[58] Field of Search ............ 437/51, 56, 57, 54, 437/245, 246; 357/71, 68, 45

[56] References Cited

U.S. PATENT DOCUMENTS

| | | | |
|---|---|---|---|
| 3,877,051 | 4/1975 | Calhoun | 357/15 |
| 4,172,004 | 10/1979 | Alcorn | 357/71 |
| 4,409,725 | 10/1983 | Hotta et al. | 437/56 |
| 4,451,326 | 5/1984 | Gwozdz | 357/71 |
| 4,455,742 | 6/1984 | Williams et al. | 437/56 |
| 4,498,228 | 2/1985 | Jillie, Jr. et al. | 437/51 |
| 4,500,906 | 2/1985 | Ohno | 357/71 |
| 4,523,216 | 6/1985 | Shiotari | 357/71 |
| 4,590,130 | 5/1986 | Cline | 437/56 |
| 4,764,476 | 8/1988 | Yamazaki et al. | 437/51 |
| 4,818,716 | 4/1989 | Ohuyama et al. | 437/51 |

FOREIGN PATENT DOCUMENTS

| | | | |
|---|---|---|---|
| 57-10230 | 1/1982 | Japan | 437/51 |
| 1162349 | 6/1989 | Japan | 437/51 |
| 2-12859 | 1/1990 | Japan | 437/51 |

Primary Examiner—Brian E. Hern
Assistant Examiner—Kevin M. Picardat
Attorney, Agent, or Firm—Skjerven, Morrill, MacPherson, Franklin & Friel

[57] ABSTRACT

A structure and method for forming a semicustom integrated circuit in which customization can be performed using only a single masking step. Vias in an insulation layer between first and second metal are made larger than first metal lines so that after deposition of second metal, a final patterning etch can remove not only portions of the second metal to leave interconnect lines but can also remove second metal within any exposed vias and additionally remove first metal in order to disconnect selected portions of first metal lines. In order for the final etch step not to remove portions of the substrate, an extra step of planarizing the insulation layer between first and second metal is provided. The large vias provided by the structure and method also allow for shrinking the size of first and second metal lines and thus shrinking the metal line width required by the design rules for the entire semiconductor structure.

5 Claims, 6 Drawing Sheets

□ VIAS IN DIELECTRIC
▨ FIRST LAYER METAL 53

GATE ARRAY STRUCTURE AND PROCESS TO ALLOW OPTIONING AT SECOND METAL MASK ONLY

This application is a division of application Ser. No. 07/408,461, filed Sept. 15, 1989, now U.S. Pat. No. 5,023,701 which is a continuation of application Ser. No. 07/175,834, filed Mar. 31, 1988, now abandoned.

FIELD OF THE INVENTION

This invention relates to a process and structure for forming metallization in a semiconductor structure. More particularly, it relates to forming metallization above semiconductor gate arrays so that custom circuits can be completed in less time.

BACKGROUND

Gate arrays are arrays of semiconductor circuit elements formed in the substrate of a semiconductor device according to several standard designs usually up to the point where electrical interconnects are fabricated. The electrical interconnects are applied according to a custom pattern to cause the resulting integrated circuit to perform a particular desired function. The electrical interconnects usually comprise two layers of metal (or sometimes metal silicide for the first layer) lines, with vias formed between the two layers to connect the two layers at selected locations.

The formation of the gate arrays in a semiconductor substrate as a standard on-the-shelf item greatly reduces the time required to produce a finished semicustom integrated circuit after it has been ordered by the customer. However, in current semicustom integrated circuit processing techniques, three custom masking steps remain to be performed after a custom integrated circuit is ordered. These three steps are to deposit and pattern the first layer of metal, to deposit a layer of insulation and pattern the vias (openings in the insulation above the first layer of metal), and to deposit and pattern a second layer of metal, thus completing the interconnections to form the integrated circuit. A final passivation layer is usually applied and patterned for protection from the elements.

SUMMARY

The structure and process of this invention allow for applying the first layer of metal, and patterning it with a universal (usable for many custom circuits) first layer mask, depositing the dielectric and patterning this with a universal via mask, and depositing the second layer of metal, all as part of the standard process of producing a gate array integrated circuit. Custom masking steps to complete a circuit are then required only for patterning the second layer of metal. As a novel feature of this invention, the step of patterning the second layer of metal also selectively opens connections in the first layer of metal, thus producing the intended circuit function.

The structure and method of this invention decrease the time and number of custom steps remaining to complete the integrated circuit after it is ordered in comparison to a standard gate array metallization process. The cost of manufacture is also significantly reduced because only one custom mask is required.

The structure and process of this invention also have a larger tolerance for alignment error in the relative locations of the first metal layer lines, the vias and the second metal layer lines.

In contrast to the prior art, by making vias wider than the lines which they will connect, and by planarizing the insulation layer deposited on the first metal before forming the vias, the step of etching after patterning and depositing second metal removes not only the second metal from unwanted areas but also removes second metal extending into vias located beneath exposed second metal and further removes the first metal located beneath these exposed vias. It is necessary that the vias be wider than the first layer metal lines in order for etching of second metal after patterning to result in also cleanly cutting the first layer metal lines beneath the exposed vias. However, when forming vias larger than the metal lines beneath them, extra precautions must be taken to avoid etching the silicon substrate adjacent to the metal lines and beneath the vias when these large vias are being etched. Planarizing the dielectric layer deposited on the first metal layer allows for a controlled via etch down to the first metal without exposing the substrate. With this invention, a standard first metal pattern having excess interconnections can be manufactured, and unnecessary first metal interconnections cut during the second metal patterning step to form a circuit performing the desired logic function.

A preferred standard layout provides first layer metal everywhere it is likely to be needed in any of many possible circuit designs. A preferred standard layout also provides oversized vias above first layer metal everywhere it is likely that first metal lines will have to be cut for any of many circuit designs. Then a single custom mask can pattern second metal and also provide for cutting first metal where necessary.

As another feature of this invention, first and second metal are of the same material or of materials which can be etched with the same etchant. A preferred embodiment uses aluminum or an aluminum alloy. Alternatively two different materials can be used for first and second layer interconnects and the two materials etched sequentially with sequential etchants.

As another feature of this invention, if it is desirable to protect certain portions of first layer metal over which vias will be placed for second layer contact, but where it is not desired that first layer lines be cut, a layer of a barrier metal which responds differently to the etchant used for etching first layer metal can be placed over these portions of first layer metal so that etching the second layer metal will not also etch the first layer metal beneath the barrier metal.

Providing this barrier metal allows oversized vias. This has the advantage that the lines of first layer metal can be made smaller because alignment error tolerance can be provided by the vias instead of the first metal lines. Second metal can likewise be made smaller. This means that the entire device can be scaled smaller. Thus the structure and method of this invention result not only in faster turnaround time between order and shipment, but a more compact device allowing for a more complex integrated circuit on a die of a given size.

DETAILED DESCRIPTION

Figures 1A, 1B:
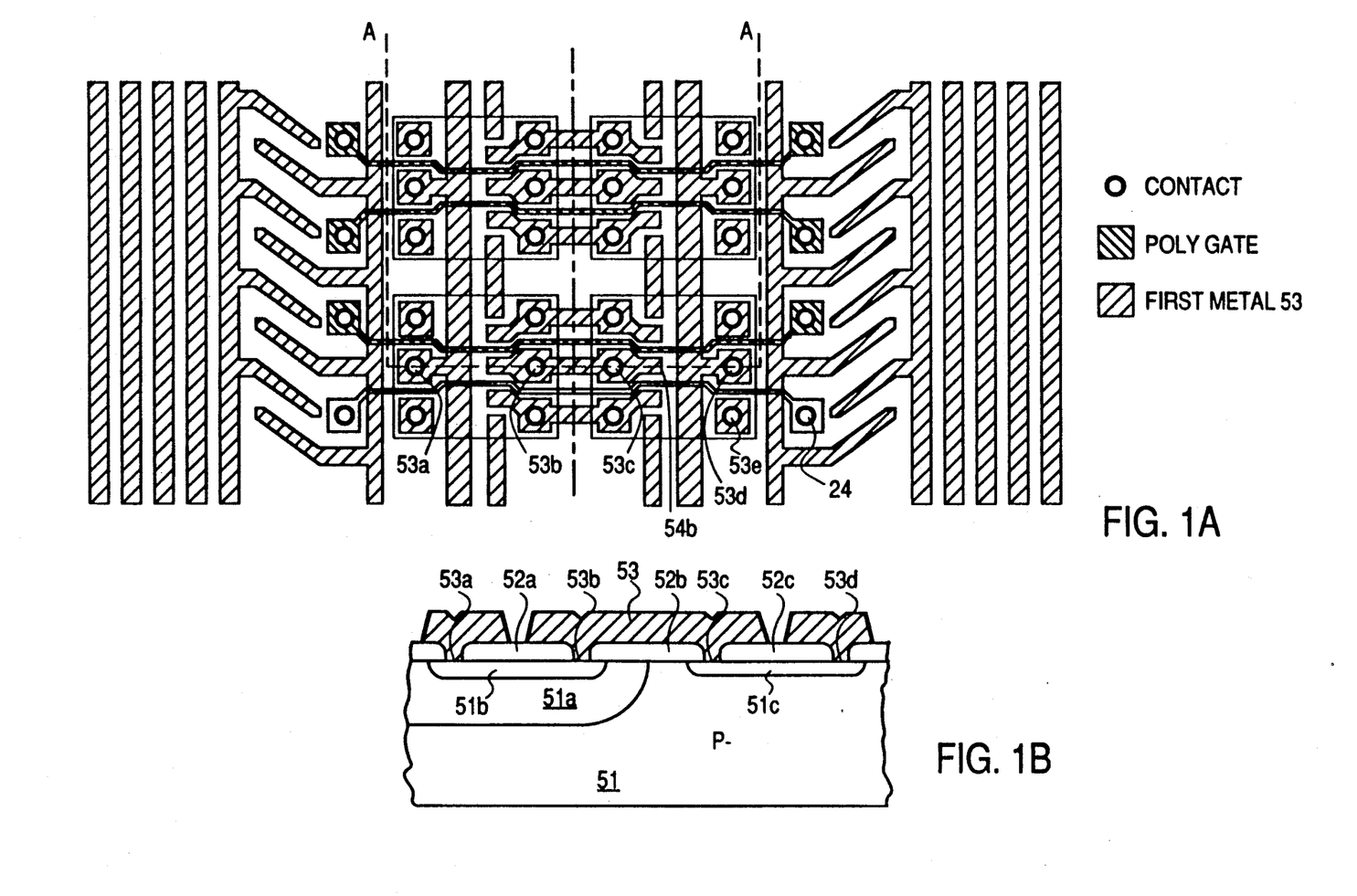
FIGS. 1a and 1b show in plan and side views a first metal interconnect pattern above a gate array substrate formed using the teachings of this invention.

FIGS. 1a and 1b show respectively a top view and a cross sectional view, the cross section of FIG. 1b taken along line A—A of FIG. 1a, which shows a first metallization layer deposited on a gate array substrate. The same numerical designations represent the same elements throughout the description and figures.

The layout shown in FIG. 1a is commonly used for forming CMOS structures having groups of four transistors useful for implementing AND, OR, NAND, NOR and other logic functions. FIG. 1b shows P-type substrate 51, which has formed therein N-type well 51a. Before formation of metallization layer 53, an oxide insulation layer 52 will have been formed on the surface of the substrate, and gates such as gate 24 (FIG. 1a) will have been formed, patterned, and used to form self-aligned source regions (not shown in the FIG. 1b cross section), P+ drain region 51b in well 51a and N+ drain region 51c in substrate 51. At the point in the process represented by FIG. 1b, metallization layer 53 (first metal) has been deposited on this patterned oxidation layer, making source and drain region contacts at locations such as 53a, 53b, 53c, and 53d, and has been patterned to produce metal interconnects. Oxide regions 52a and 52c are thus exposed.

A single gate, such as gate 24 shown in FIG. 1a controls adjacent N-channel and P-channel transistors. The N-channel transistor has drain contacts 53c, 53d. The P-channel transistor has drain contacts 53a, 53b. In the example of FIG. 1a, polycrystalline silicon gate 24 controls electron flow through two substrate channels, for example between the source region located beneath contact 53e and the drain region located beneath contact 53d. Each source, drain, channel and gate comprise one MOS transistor.

The particular logic function depends upon the patterning of first and second metal connections. According to the present invention, custom patterning of both first and second metal to achieve a wide variety of logic functions can be performed in a single step, as will be described.

Figure 2:
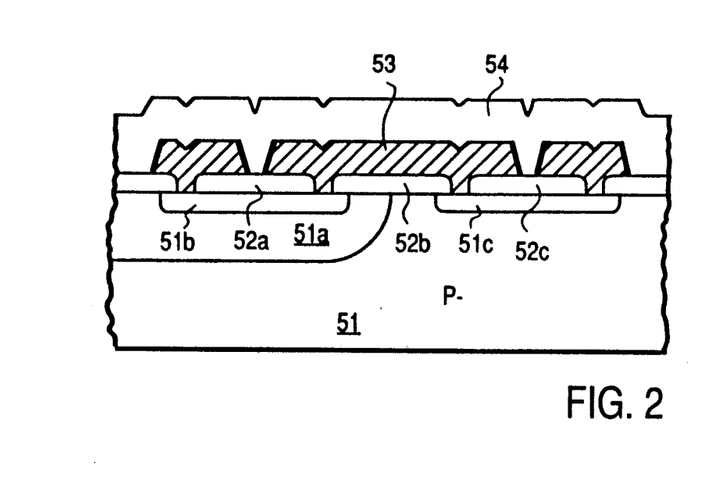
FIG. 2 shows the structure of FIG. 1b with the addition of an insulation layer.
Figure 3:
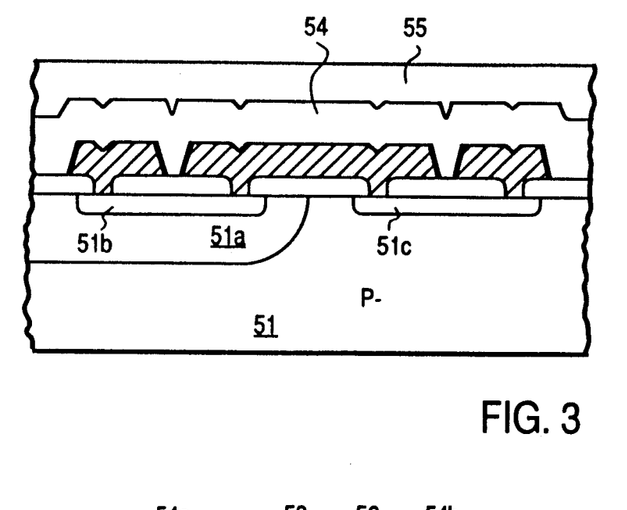
FIG. 3 shows the structure of FIG. 2 with the addition of a layer of photoresist.

Next, in order to planarize metallization layer 53, a layer of insulation 54 is applied (see FIG. 2), to the surface of the structure shown in FIG. 1b. Then, a layer of photoresist 55 is applied to insulation layer 54 as shown in FIG. 3.

Figure 4A:
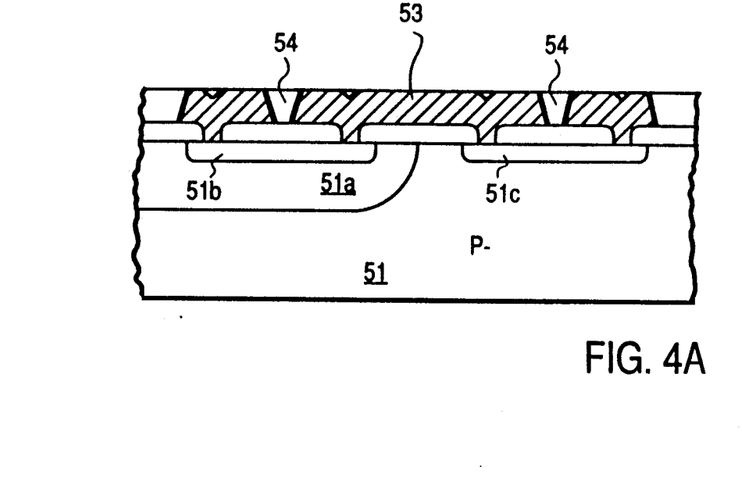
FIG. 4a shows the structure of FIG. 3 planarized to the level of first metal.
Figure 4B:
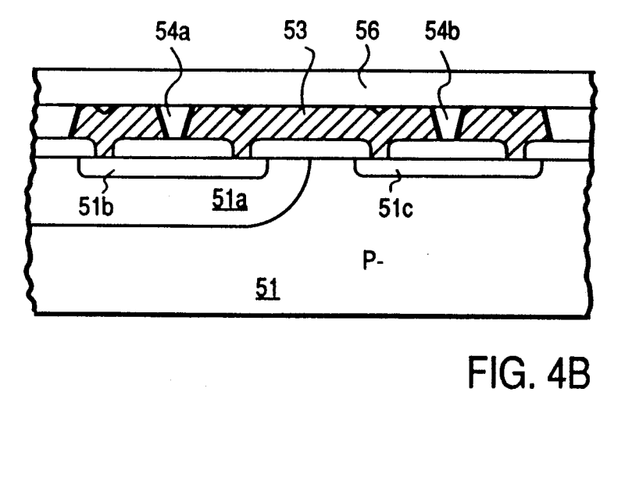
FIG. 4b shows the structure of FIG. 4a with a dielectric layer added.

As shown in FIG. 4, photoresist layer 55 and insulation layer 54 are etched by a process which removes photoresist 55 at substantially the same rate as it removes insulation layer 54. Etching is continued until upper portion 54a of insulation layer 54 is removed and first metallization layer 53 is exposed. The etch may be ended at an earlier point when all photoresist is removed, thus producing a flat top layer, or, preferably ended at this later point when first metallization layer 53 is exposed. Stopping when first metal is exposed is advantageous because it allows for redepositing a layer of dielectric to a predictable thickness above first metal. In either case the upper surface is flat. Importantly, as FIG. 4a shows, substrate 51 is nowhere exposed. Then, as shown in FIG. 4b, dielectric is again deposited over the entire surface as layer 56.

Alternatively, to achieve planarization of insulation layer 54, a layer of polyimide may be applied to insulation layer 54 instead of applying photoresist 55. Polyimide is self-leveling and avoids the step of having to remove photoresist plus plasma oxide and then redeposit plasma oxide. However, polyimide will absorb moisture if left exposed and thus may need to be passivated with a layer of plasma oxide.

As a further alternative, using spin-on glass to form insulation layer 54 can produce leveling. Thus spin-on glass allows insulation layer 54 to be planarized directly. In the past, spin-on glass has not been preferred because the purity level in available spin-on glass has not been sufficiently high.

Because of the planarization step the dielectric at locations 54a and 54b below the top of first metal 53 is etched away very little.

This planarization step is an important feature of the invention. Without it, providing the oversized vias of this invention would result in etching the silicon substrate 51 at roughly the same time as the top surface of first metal 53 becomes exposed during via etch.

Figure 5A:
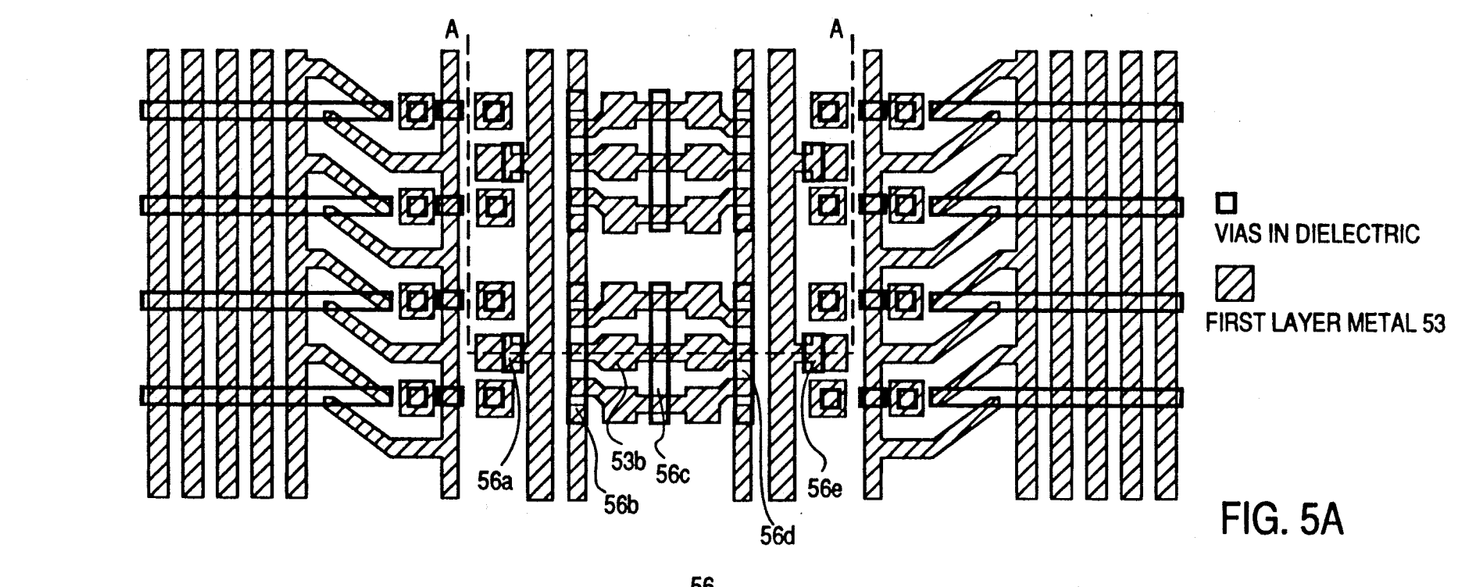
FIGS. 5a and 5b show plan and cross-sectional views of the structure of FIG. 4 in which the dielectric layer of FIG. 4b has been patterned to form vias.
Figure 5B:
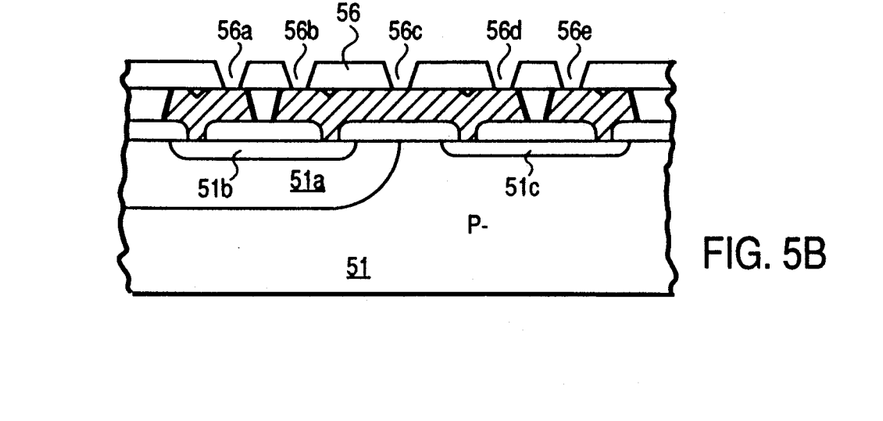
Figure 6:
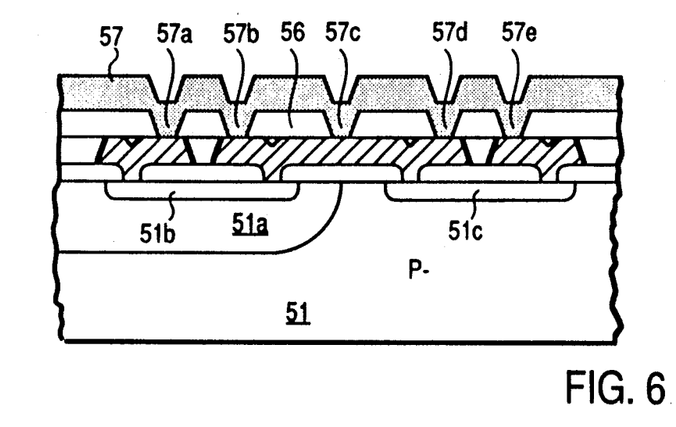
FIG. 6 shows the structure of FIG. 5b with the addition of a second layer of metal.

FIG. 5a shows a plan view and FIG. 5b shows a cross-sectional view in which insulation layer 56 has been deposited and vias 56a, 56b, 56c, 56d and 56e have been formed at all locations where it may later be desirable to connect second metal to first metal or to break contact in the earlier formed first metal. FIG. 5b is a cross-sectional view of FIG. 5a taken along the line A—A. As shown in FIG. 5b, insulation layer 56 is deposited onto the top of the planarized layer comprising metallization layer 53 and insulation layer 54. Passivation layer 56 is then patterned to form vias such as 56a, 56b, 56c, 56d and 56e. Next, as shown in FIG. 6, second metallization layer 57 is deposited onto the top surface of the semiconductor wafer forming contact regions 57a, 57b, 57c, 57d and 57e in the vias which were formed in insulation layer 56.

All these steps are part of forming a universal semiconductor structure which can be used for multiple custom circuits, depending upon the mask used for patterning of second metal layer 57.

Figure 7:
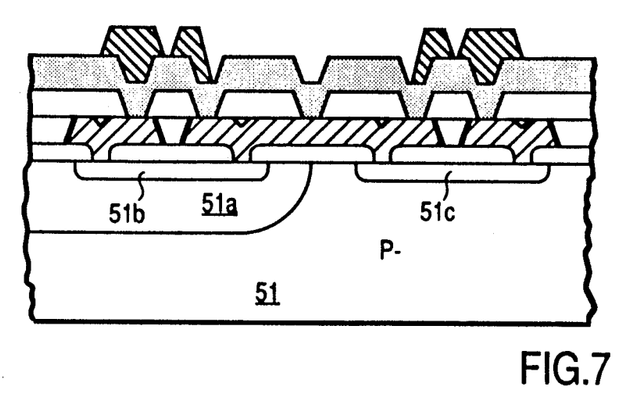
FIG. 7 shows the structure of FIG. 6 to which a custom layer of photoresist has been applied and patterned.
Figures 8A, 10:
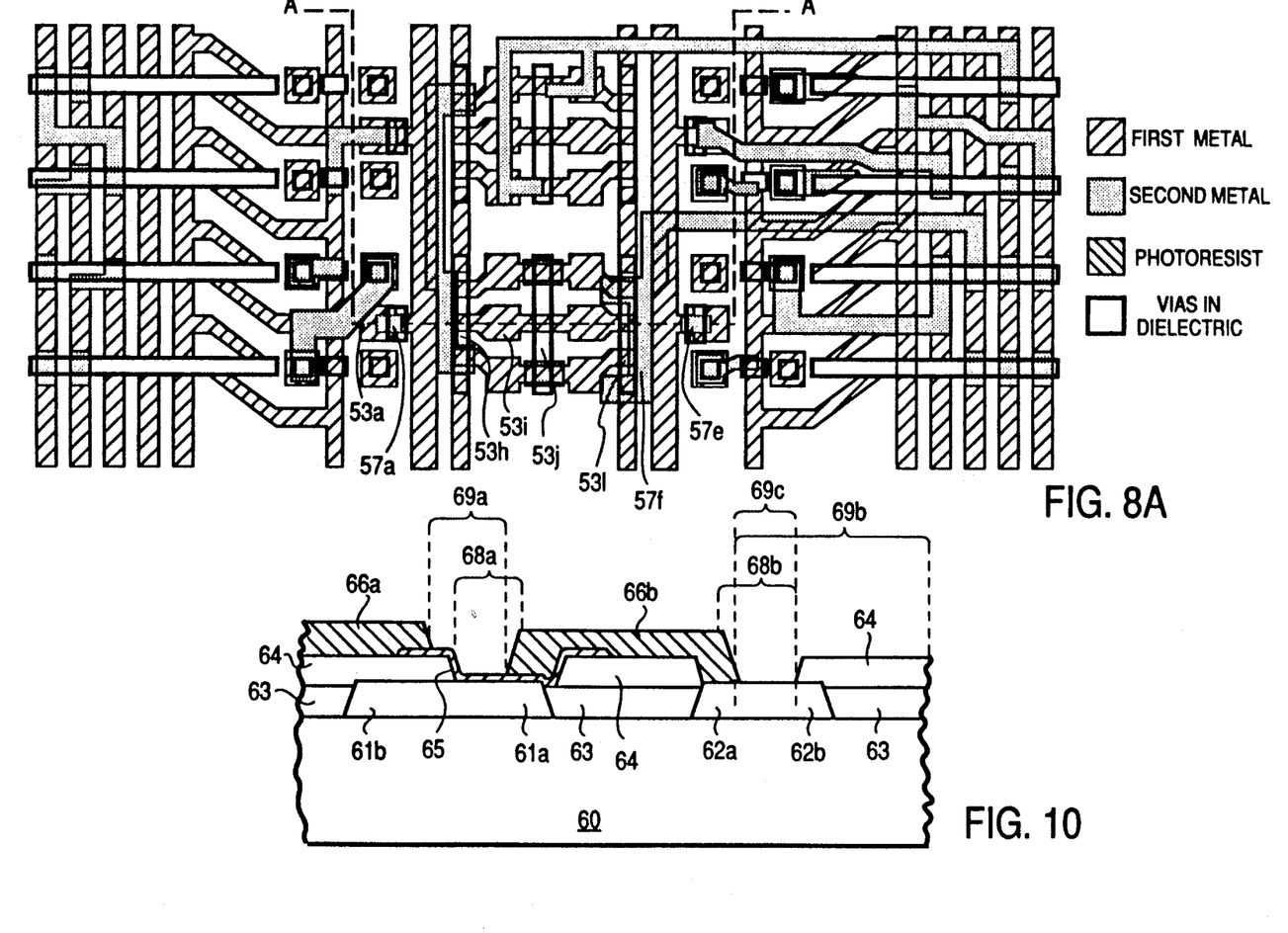
FIGS. 8a and 8b show the structure of FIG. 7 in which layers of first and second metal are removed where not covered by photoresist.
FIG. 10 shows the side view of a structure similar to that of FIG. 9 in which a layer of barrier metal has been applied and patterned over the insulation and the exposed first layer metal.
Figure 8B:
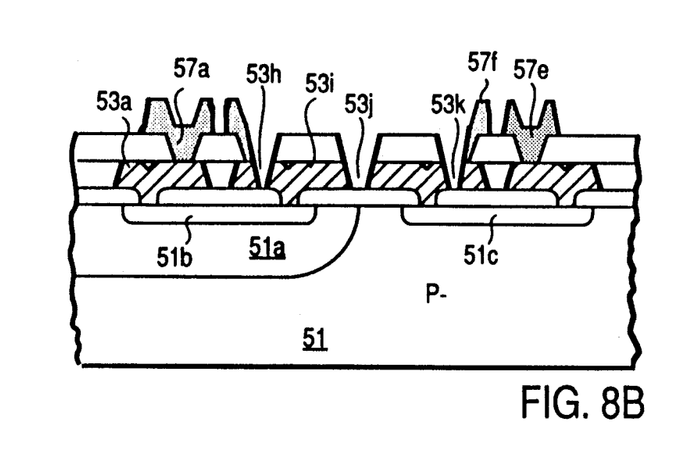

FIGS. 7, 8a, 8b, and 9 show the final customization steps necessary to produce the circuit specified by a customer. As shown in FIG. 7, photoresist layer 58 is deposited onto second metal layer 57 and patterned into regions 58a, 58b, 58c, and 58d using the single custom mask which can be used with this invention. This patterning exposes locations at which second and also some first metal are to be removed. As shown in FIG. 8b, these exposed portions are removed. The remaining photoresist is also removed. A plasma or reactive ion etching process can be selected to avoid undercutting of first and second metal.

Figure 9:
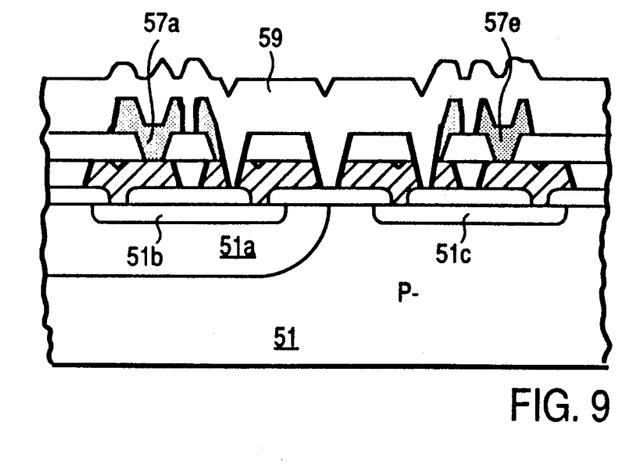
FIG. 9 shows the structure of FIG. 8b to which a final insulation layer has been applied.

In FIG. 8b, portions of second metal 57, some of the second metal contacts, and portions of the first metal have been removed. The resulting circuit is shown in plan view in FIG. 8a. As shown in FIG. 9, after removal of unwanted portions of first and second metal, a final passivation layer 59 is formed.

As shown in FIG. 8b, the patterning step has resulted in the removal of second metal region 57g (shown in FIG. 7), thereby severing the connection between second metal regions 57f and 57e. The patterning has also resulted in removal of second metal contact regions 57c, part of second metal contact regions 57b and 57d, plus the further removal of first metal regions 53h, 53j, and 53l (see FIG. 8b). Therefore connections have been severed between second metal region 57a and first metal region 53i. Connections have not been severed between second metal region 57a and first metal region 53a, in spite of the fact that no photoresist protected second metal above first metal region 53a. This is because vias in insulation layer 56 were not formed above first metal region 53a. Thus the structure and method of this invention allow for both flexibility in the design of a semicustom circuit and the speed and low cost of a single custom masking step, resulting in low cost and fast delivery to the customer.

The single masking and patterning step shown in FIG. 7 thus results in the customization of an entire circuit. In the prior art, typically three custom masking/patterning steps were required for producing a semicustom circuit, one for patterning first metal, one for patterning vias, and one for patterning second metal. By contrast, with the method of this invention, only the single custom patterning step after depositing second metal is required to form a semicustom circuit.

Because of the planarization used after patterning of first metal and insulation of the patterned regions (for example, regions 54a and 54b) the vias for second metal contact need not be smaller than the surrounding metal lines. Therefore vias can serve the dual function of allowing for contact between first and second metal and of breaking the contact between adjacent first metal regions.

As another feature of this invention, given there is no requirement that vias be contained within the bounds of the first metal lines, first metal lines can be made narrower than under prior art design rules while maintaining sufficient alignment error tolerance for vias. A prior art device which does not planarize the insulation layer above first metal must keep the vias from overlapping first metal, because without planarizing, an etch step would etch or at least expose the silicon substrate. Prior art design rules may require above the first metal lines a 1-micron space on each side of a via to allow for alignment error and to avoid having the vias overhang the first-metal line. Thus for a 3-micron via the prior art line width must be 5 microns. Eliminating the prior art requirement that vias not overhang first metal allows the first metal to be at least 2 microns smaller, and if vias are permitted (or desired) to overhang first metal, the first metal lines can be shrunk, in our example, from a 5-micron width to a one- or two-micron width. Thus the design rules can be remarkably shrunk and the overall device made remarkably smaller. This same principle will apply if in the future tolerances become tighter and line widths can be further reduced.

In some cases it may be desirable to provide contact between first and second metals through a via, but to allow the contact between first and second metal to be broken without allowing the first metal line to be broken.

In this case, after forming and patterning the first metal layer, and forming and patterning the insulation layer above it, a thin layer of a barrier metal is deposited and patterned before the second metal layer is deposited. The barrier metal formation increases the number of steps needed to form the structure, however these extra steps occur during formation of the universal structure and do not lengthen the customization process. The number of custom masks needed remains one. The barrier metal is selected to be resistant to an etchant used to etch the first and second metal lines. The barrier metal is patterned to be located above vias in the insulation layer where it is desirable not to break the first metal layer beneath the vias. FIG. 10 shows a side view of a structure in which a barrier metal has been used. As shown in FIG. 10, two regions 61 and 62 of first metal have been formed. Planarization oxide layer 63 has been followed by the formation and patterning of oxide layer 64. After formation of these oxide layers, a layer 65 of barrier metal was formed and patterned. As shown in FIG. 10, barrier metal region 65 is larger than the first metal regions 61a and 61b it must protect. Thus, alignment is not critical.

In customizing the structure of FIG. 10, the goal is to leave region 66b of second metal connecting first metal region 61a to first metal region 62a, also to sever the connection from second metal region 66a to first metal regions 61a or 61b and to sever the connection between first metal regions 62a and 62b but not to sever the connection between regions 61a and 61b. As shown in FIG. 10, barrier metal 65 has been patterned to cover first metal regions 61a and 61b but not to cover first metal regions 62a and 62b.

Before custom patterning, the second metal layer contacts first metal regions 61a and 61b through barrier metal 65 and via 68a. The second metal layer contacts regions 62a and 62b through via 68b. The single custom mask patterns the photoresist to cause openings to be etched in second metal at regions 69a and 69b. Etching of opening 69a is stopped by barrier metal 65 while etching of opening 69b proceeds in region 69c until regions 62a and 62b are separated. At this point in the process, barrier metal layer 65 connects second metal region 66a to first metal regions 61a and 61b. A subsequent etch of this barrier metal (not requiring further masking and patterning) removes the exposed portions of barrier metal 65, thus severing connection from second metal region 66a to first metal regions 61a and 61b.

Tolerance in alignment of the barrier metal is not critical because the barrier metal region may be made sufficiently larger than the via it is to cover. Also, providing the barrier metal does not further restrict alignment tolerances for the custom mask. Opening 69a between second metal regions 66a and 66b need be only wide enough to assure separation between these adjacent second metal regions. Alignment between the custom mask and the cell to be customized must only be sufficient that region 66b contacts region 61a and 62a, that the first metal gap between regions 62a and 62b is sufficient for reliable separation, and that region 66a is separated from region 61b.

A barrier metal which has been successfully used with a silicon substrate, silicon oxide insulation, and aluminum first and second metal is titanium-tungsten. When this combination of materials is used, the titanium-tungsten barrier is placed above rather than below the insulation layer because the fluorine based etchants preferably used to form vias in the oxide would also remove the titanium-tungsten.

Figures 11A, 11B, 11C, 11D, 11E:
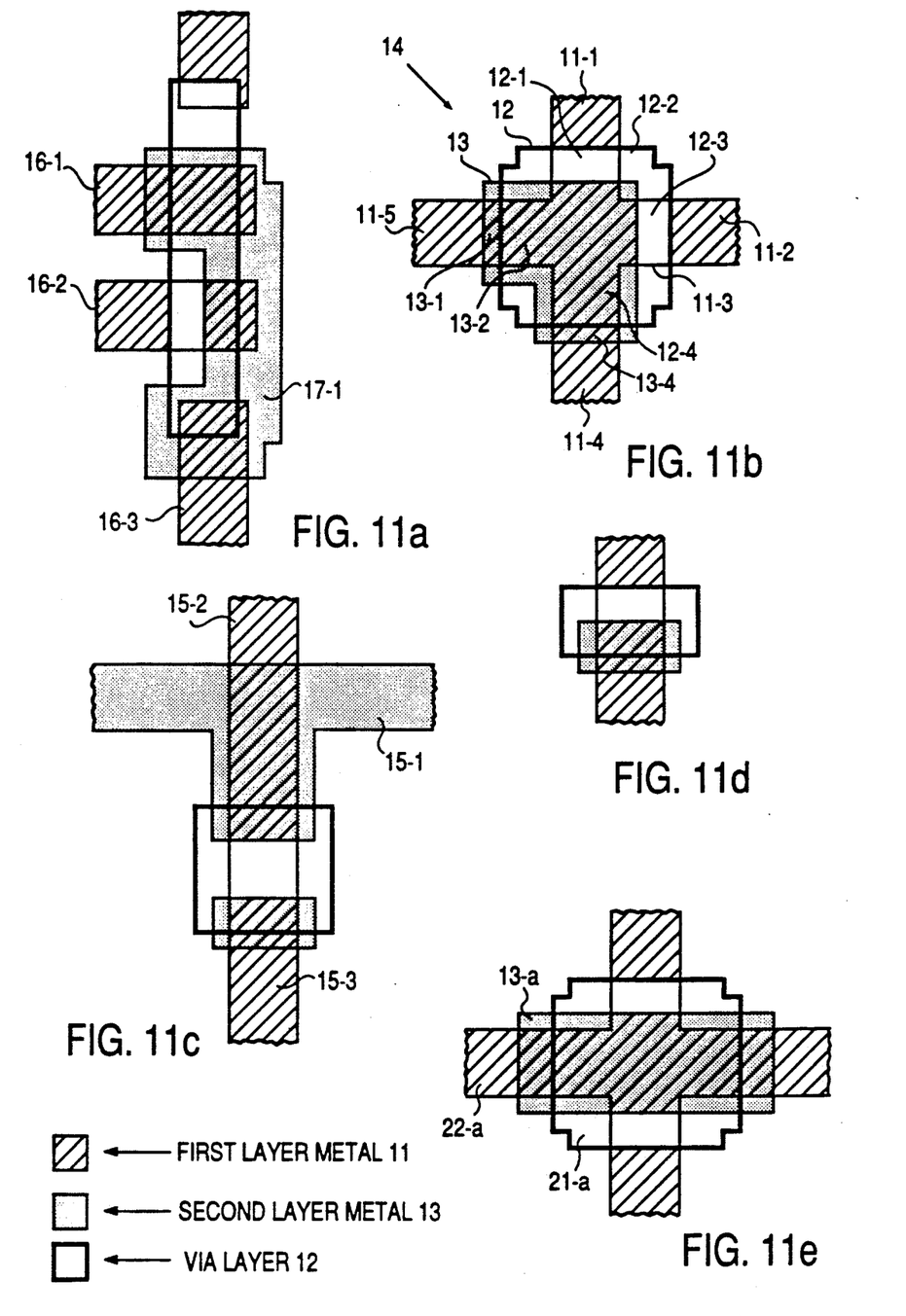
FIGS. 11a-11e show plan view layouts of vias and interconnects which can be made using the teachings of this invention.

FIGS. 11a-11e show some geometries of first metal, via, and second metal patterning to achieve various connection patterns with the single custom mask of this invention. In FIG. 11b, first metal layer 11 was patterned after deposition to leave a cross-shaped pattern as indicated by outline 11-3. After forming an insulation layer above the patterned first metal cross-shaped pattern, via 12 is patterned into the insulation layer, thus exposing the center of first metal cross 11-3. Deposition of second metal 13 onto the upper surface of the wafer causes second metal 13 to contact first metal cross 11-3 within the outline of via 12. FIG. 11b shows the remaining structure after patterning of second metal 13, in which only an L-shaped portion of second metal 13 remains. In region 12-1, the removal of second metal 13 where via 12 is located has resulted in removal of first metal 11 from the original cross-shaped first metal pattern 11-3, thus severing electrical connection between first metal region 11-1 and first metal regions 11-2 and 11-4. The presence of the insulation layer above first metal regions 11-1 and 11-2 prevents the subsequent removal of second metal 13 from also removing first metal regions 11-1 and 11-2. In region 13-1, second metal remains above but separated by insulation layer 12 from first metal. In region 13-2, which is within via 12, second metal 13 is in contact with first metal 11. Thus, it can be seen that the second metal pattern selected in FIG. 11b has resulted in retaining the electrical connection between first metal regions 11-4 and 11-5 while severing connections to first metal regions 11-1 and 11-2.

Other patterns are shown in FIGS. 11a, 11c, 11d, and 11e. In FIG. 11d, a first metal line over which a via is located has been severed during second metal patterning. In FIG. 11c., first metal region 15-2 has been severed from first metal region 15-3 while remaining connected to second metal region 15-1. In FIG. 11a, second metal region 17-1 connects regions 16-1 and 16-3 to each other but leaves region 16-2 disconnected. Of course many other geometries will be obvious to those skilled in the art. Second metal, as used with this invention, can also pass above first metal regions covered by an insulation layer and provide a jumper between remote portions of first metal or remote portions of the semiconductor substrate. Thus it is clear that great flexibility in customizing circuits can be achieved through the single patterning step used with this invention.

This provides a full and complete disclosure of the invention. Additional embodiments incorporating the teachings of this invention will become obvious to those skilled in the art in light of this disclosure. In particular, it will be obvious that an embodiment including a third layer of metal can be formed so that a single patterning step performed after deposition of the third layer of metal can result in a semicustom circuit having three metal layers. It will also be obvious that subsequent custom steps can be performed after performing the single custom step which removes portions of more than one layer of metal. Such variations are intended to fall within the scope of this invention.

I claim:

1. A method for forming a semiconductor structure comprising:

forming a semiconductor substrate having semiconductive structures formed therein;

forming on said semiconductor substrate a first insulation layer;

patterning said first insulation layer to expose portions of said substrate;

forming on said first insulation layer and said exposed portions of said substrate a first conductive layer;

patterning said first conductive layer to leave first conductive lines having a first line width and leaving contacts contacting said substrate;

forming a second insulation layer above said first conductive lines and said first insulation layer;

patterning said second insulation layer to form vias, at least some of which are at least as wide as said first line width, and positioned to expose the full width of portions of said first conductive lines; and forming a second conductive layer on said second insulation layer and said exposed portions of said first conductive lines;

said first metal lines and said vias being arranged such that subsequent patterning of said second conductive layer and said first conductive layer, thereby breaking electrical connection between selected portions of said second conductive layer, selected connections between said second and first conductive layers, and selected connections between selected portions of said first conductive layer.

2. A method for forming a semiconductor structure as in claim 1 further comprising the step after forming said second conductive layer of patterning said semiconductor structure to remove portions of said first and second conductive layers, thereby forming a semicustom integrated circuit.

3. A method for forming a semiconductor structure as in claim 1 in which said vias are wider than said first conductive lines, thereby allowing tolerance in alignment between said vias and said first conductive lines.

4. A method for forming a semiconductor structure as in claim 1 further comprising the step of forming a barrier metal layer between said second conductive layer and said second insulation layer.

5. A method for forming a semiconductor structure as in claim 4 further comprising the step of patterning said barrier metal layer to expose portions of said first conductive layer.

* * * * *